United States Patent
Chi et al.

(10) Patent No.: US 11,004,502 B2
(45) Date of Patent: May 11, 2021

(54) STORAGE UNIT AND STATIC RANDOM ACCESS MEMORY

(71) Applicant: Huawei Technologies Co., Ltd., Shenzhen (CN)

(72) Inventors: Sijie Chi, Shenzhen (CN); Bingwu Ji, Shenzhen (CN); Tanfu Zhao, Shenzhen (CN); Yunming Zhou, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 16/807,594

(22) Filed: Mar. 3, 2020

(65) Prior Publication Data

US 2020/0202922 A1 Jun. 25, 2020

Related U.S. Application Data

(63) Continuation of application No. PCT/CN2018/084100, filed on Apr. 23, 2018.

(30) Foreign Application Priority Data

Sep. 4, 2017 (CN) .......................... 201710785410.5

(51) Int. Cl.
*G11C 11/412* (2006.01)
*G11C 11/418* (2006.01)
*G11C 11/419* (2006.01)

(52) U.S. Cl.
CPC .......... *G11C 11/412* (2013.01); *G11C 11/418* (2013.01); *G11C 11/419* (2013.01)

(58) Field of Classification Search
CPC ... G11C 11/412; G11C 11/418; G11C 11/419; G11C 7/1075; G11C 7/1045; G11C 7/12;
(Continued)

(56) References Cited

U.S. PATENT DOCUMENTS

| 5,818,765 A | 10/1998 | Taniguchi et al. |
| 6,314,047 B1 * | 11/2001 | Keay ........................ G11C 8/16 365/189.02 |

(Continued)

FOREIGN PATENT DOCUMENTS

| CN | 1178988 A | 4/1998 |
| CN | 101385088 A | 3/2009 |

(Continued)

OTHER PUBLICATIONS

Shibata, N., "A Current-Sensed High-Speed and Low-Power First-In-First-Out Memory Using a Wordline/Bitline-Swapped Dual-Port SRAM Cell," IEEE Journal of Solid-State Circuits, IEEE, USA, vol. 37, No. 6, XP001222569, Jun. 1, 2002, pp. 735-750.

*Primary Examiner* — Michael T Tran
(74) *Attorney, Agent, or Firm* — Conley Rose, P.C.

(57) ABSTRACT

A storage unit and a static random access memory (SRAM), where storage unit includes a latch, and the latch provides a first storage bit. The storage unit further includes a first metal-oxide-semiconductor (MOS) transistor. A gate of the first MOS transistor is coupled to the first storage bit, a source of the first MOS transistor is coupled to a first read line, and a drain of the first MOS transistor is coupled to a second read line. In a first state, the first read line is a read word line, and the second read line is a read bit line, or in a second state, the second read line is a read word line, and the first read line is a read bit line. The storage unit according to embodiments of the present invention can implement an exchange between a read word line and a read bit line.

20 Claims, 9 Drawing Sheets

(58) Field of Classification Search
CPC ........... G11C 7/1006; G11C 8/14; G11C 7/18;
G11C 8/08; G11C 8/16
USPC ............................................ 365/156, 189.05
See application file for complete search history.

(56) References Cited

U.S. PATENT DOCUMENTS

| | | | | |
|---|---|---|---|---|
| 6,906,937 | B1* | 6/2005 | Nataraj | G11C 15/04 365/154 |
| 7,468,902 | B2* | 12/2008 | Liaw | G11C 11/412 365/154 |
| 8,223,579 | B2* | 7/2012 | Takeyanna | G11C 11/412 365/230.05 |
| 8,498,174 | B2* | 7/2013 | Chiu | G11C 11/412 365/230.05 |
| 8,520,454 | B2* | 8/2013 | Ouchi | H01L 27/1104 365/189.15 |
| 8,522,178 | B2* | 8/2013 | Ganesan | G06F 30/3312 716/108 |
| 8,526,228 | B2* | 9/2013 | Chang | G11C 11/412 365/175 |
| 8,531,873 | B2* | 9/2013 | Teman | G11C 11/412 365/156 |
| 8,773,944 | B2* | 7/2014 | Chen | H03M 13/2707 365/238.5 |
| 8,995,176 | B2* | 3/2015 | Liaw | H01L 27/0924 365/154 |
| 9,263,122 | B2* | 2/2016 | Yang | G11C 8/16 |
| 9,275,710 | B2* | 3/2016 | Chan | G11C 8/14 |
| 9,721,645 | B1* | 8/2017 | Liaw | G11C 11/412 |
| 10,692,935 | B2* | 6/2020 | Kwon | H01L 27/1108 |
| 10,748,602 | B2* | 8/2020 | Liu | G11C 7/1057 |
| 2003/0031072 | A1 | 2/2003 | Louzoun et al. | |
| 2004/0053510 | A1* | 3/2004 | Little | G11C 11/412 438/776 |
| 2008/0101144 | A1 | 5/2008 | Chen | |
| 2008/0123462 | A1* | 5/2008 | Liaw | H01L 27/1104 365/230.05 |
| 2008/0198681 | A1* | 8/2008 | Kenkare | G11C 8/10 365/230.05 |
| 2008/0273382 | A1* | 11/2008 | Wang | H01L 27/11 365/181 |
| 2009/0141528 | A1 | 6/2009 | Arsovski et al. | |
| 2010/0085807 | A1 | 4/2010 | Vali et al. | |
| 2010/0091585 | A1* | 4/2010 | Wang | G11C 11/412 365/189.011 |
| 2010/0259971 | A1* | 10/2010 | Liaw | G11C 8/16 365/154 |
| 2011/0058428 | A1 | 3/2011 | Takashima | |
| 2011/0103137 | A1 | 5/2011 | Beat | |
| 2011/0280073 | A1* | 11/2011 | Chiu | G11C 13/0002 365/185.08 |
| 2012/0195105 | A1* | 8/2012 | Wang | G11C 11/412 365/154 |
| 2012/0195111 | A1* | 8/2012 | Ramaraju | G11C 8/16 365/156 |
| 2013/0107610 | A1 | 5/2013 | Mann et al. | |
| 2013/0322194 | A1* | 12/2013 | Rachamadugu | G11C 7/12 365/203 |
| 2014/0138776 | A1* | 5/2014 | Chang | H01L 27/1104 257/369 |
| 2014/0269008 | A1* | 9/2014 | Baker, Jr. | G11C 13/0002 365/148 |
| 2015/0146480 | A1* | 5/2015 | Chen | G11C 8/08 365/156 |
| 2015/0170735 | A1* | 6/2015 | Paul | H01L 27/0207 365/154 |
| 2016/0240539 | A1* | 8/2016 | Mojumder | H01L 23/5226 |
| 2016/0351257 | A1* | 12/2016 | Wu | G11C 13/0069 |
| 2017/0011006 | A1 | 1/2017 | Saber et al. | |
| 2017/0221905 | A1* | 8/2017 | Chen | H01L 23/5226 |
| 2018/0174647 | A1* | 6/2018 | Takahashi | G09G 3/36 |

FOREIGN PATENT DOCUMENTS

| | | |
|---|---|---|
| CN | 104900258 A | 9/2015 |
| CN | 105575421 A | 5/2016 |
| GB | 2460049 A | 11/2009 |
| JP | S61246996 A | 11/1986 |
| JP | S63140483 A | 6/1988 |
| JP | H03192595 A | 8/1991 |
| JP | H05152542 A | 6/1993 |
| JP | 2011060362 A | 3/2011 |
| WO | 2006076378 A1 | 7/2006 |

* cited by examiner

STORAGE UNIT AND STATIC RANDOM ACCESS MEMORY

CROSS-REFERENCE TO RELATED APPLICATIONS

This application is a continuation of International Patent Application No. PCT/CN2018/084100 filed on Apr. 23, 2018, which claims priority to Chinese Patent Application No. 201710785410.5 filed on Sep. 4, 2017. The disclosures of the aforementioned applications are hereby incorporated by reference in their entireties.

TECHNICAL FIELD

The present disclosure relates to the storage field, and in particular, to a storage unit and a static random access memory (SRAM).

BACKGROUND

FIG. 1 is a schematic structural diagram of a storage unit of a conventional SRAM. The storage unit is a common six-transistor unit, and includes six metal-oxide-semiconductor (MOS) field-effect transistors. The MOS field-effect transistor is referred to as a MOS transistor for short. Referring to FIG. 1, the storage unit includes two inverting gates and two MOS transistors. The two inverting gates include four MOS transistors. The two inverting gates in the figure form a latch configured to store data. The two MOS transistors in the figure are configured for gating access. The latch formed by circularly connecting the two inverting gates that has two stable states 0 and 1. A and B are two storage bits in opposite states. For example, when the storage bit A is a logical 0, the storage bit B is a logical 1, or when the storage bit A is a logical 1, the storage bit B is a logical 0. A word line (WL) is used to control gating access to the storage unit, and a bit line (BL) is used to perform reading/writing in the storage unit. Reading is pulling up the WL and reading bits from the BL, while writing is pulling up the WL and pulling up or pulling down the BL. Because a drive capability of the BL is stronger than that of the storage unit, an original state is forcibly overwritten. In FIG. 1, both bit and nbit represent bit lines. The bit line bit is used to read data of the storage bit A, and the bit line nbit is used to read data of the storage bit B. The data read from the storage unit using the two bit lines has opposite states.

FIG. 2 is a schematic diagram of a storage array of the conventional SRAM. The storage array includes the 3×3 storage unit shown in FIG. 1. When data is read from the conventional SRAM, only data of a specific address can be read usually. If data of an address that is symmetric to the address about a matrix diagonal needs to be obtained, the data needs to be processed by writing an algorithm into code of a peripheral digital circuit of the SRAM for processing. This manner has a low speed and comparatively high power consumption and workload.

SUMMARY

Embodiments of the present disclosure provide a storage unit and an SRAM such that a read word line and a read bit line are interchangeable, and data of an address that is symmetric to the address about a matrix diagonal can be obtained. In this way, a speed is slow, and both power consumption and workload are relatively high.

According to a first aspect, a storage unit is provided. The storage unit includes a latch, and the latch provides a first storage bit. The storage unit further includes a first MOS transistor. A gate of the first MOS transistor is connected to the first storage bit, a source of the first MOS transistor is connected to a first read line, and a drain of the first MOS transistor is connected to a second read line. In a first state, the first read line is a read word line, and the second read line is a read bit line. In a second state, the second read line is a read word line, and the first read line is a read bit line.

In this embodiment of the present disclosure, based on a conventional structure of a latch that can provide a storage bit, an MOS transistor is added. A gate of the MOS transistor is connected to the storage bit, and a source and a drain of the MOS transistor are connected to a first read line and a second read line, respectively. Based on a characteristic of the MOS transistor, either of the first read line and the second read line may be used as a read bit line, and the other is used as a read word line such that the read word line and the read bit line are interchangeable. A bottom-layer hardware storage unit is changed to quickly obtain data of an address that is symmetric to a specific address about a matrix diagonal, instead of writing an algorithm into code. An SRAM in this form is equivalent to a hardware accelerator. Compared with writing an algorithm into code of a digital circuit, changing the storage unit can greatly increase a system speed, and greatly reduce power consumption and workload. Usually, one or two cycles (i.e., clock cycle) are required to complete transpose reading, while thousands of cycles may be required when the algorithm is written into the code of the digital circuit.

In a possible implementation, the first MOS transistor is an N-type MOS (NMOS) transistor or a P-type MOS (PMOS) transistor.

In a possible implementation, the latch further provides a second storage bit. The storage unit further includes a second MOS transistor. A gate of the second MOS transistor is connected to the second storage bit, a source of the second MOS transistor is connected to the first read line, and a drain of the second MOS transistor is connected to the second read line. According to this implementation, data of two storage bits in opposite states is separately read using a pair of MOS transistors. This can improve data reading accuracy.

In a possible implementation, the first MOS transistor is the NMOS transistor and the second MOS transistor is the PMOS transistor, or the first MOS transistor is the PMOS transistor and the second MOS transistor is the NMOS transistor.

According to a second aspect, an SRAM is provided. The SRAM includes a plurality of storage units. The storage unit includes a latch, and the latch provides a first storage bit. The storage unit further includes a first MOS transistor. A gate of the first MOS transistor is connected to the first storage bit, a source of the first MOS transistor is connected to a first read line, and a drain of the first MOS transistor is connected to a second read line. In a first state, the first read line is a read word line, and the second read line is a read bit line. In a second state, the second read line is a read word line, and the first read line is a read bit line. The plurality of storage units form a rectangular storage array with a same quantity of rows and columns, where storage units of a same row in the storage array are connected to the same first read line, and storage units of a same column in the storage array are connected to the same second read line.

In this embodiment of the present disclosure, based on a conventional structure of a latch that can provide a storage bit, an MOS transistor is added into a storage unit of an SRAM. A gate of the MOS transistor is connected to the storage bit, and a source and a drain of the MOS transistor are connected to a first read line and a second read line, respectively. Based on a characteristic of the MOS transistor, either of the first read line and the second read line may be used as a read bit line, and the other is used as a read word line such that the read word line and the read bit line are interchangeable. A bottom-layer hardware storage unit is changed to quickly obtain data of an address that is symmetric to a specific address about a matrix diagonal, instead of writing an algorithm into code. An SRAM in this form is equivalent to a hardware accelerator. Compared with writing an algorithm into code of a digital circuit, changing the storage unit can greatly increase a system speed, and greatly reduce power consumption and workload. Usually, one or two cycles are required to complete transpose reading, while thousands of cycles may be required when the algorithm is written into the code of the digital circuit.

In a possible implementation, the first MOS transistor is an NMOS transistor or a PMOS transistor.

In a possible implementation, the latch further provides a second storage bit. The storage unit further includes a second MOS transistor. A gate of the second MOS transistor is connected to the second storage bit, a source of the second MOS transistor is connected to the first read line, and a drain of the second MOS transistor is connected to the second read line. According to this implementation, data of two storage bits in opposite states is separately read using a pair of MOS transistors. This can improve data reading accuracy.

In a possible implementation, the first MOS transistor is the NMOS transistor and the second MOS transistor is the PMOS transistor, or the first MOS transistor is the PMOS transistor and the second MOS transistor is the NMOS transistor.

In a possible implementation, each storage unit is connected to a control signal. When the control signal is a first sequence, the storage unit is considered to be in the first state, or when the control signal is a second sequence, the storage unit is considered to be in the second state. According to this implementation, the control signal is used to control switching of read states of the storage unit. This is simple and quick.

In a possible implementation, a length of the first sequence is 1 bit, a length of the second sequence is 1 bit, and the first sequence is 0 and the second sequence is 1, or the first sequence is 1 and the second sequence is 0. According to this implementation, the 1-bit control signal is used to control switching of read states of the storage unit. This is simple and quick.

In a possible implementation, the SRAM further includes a first decoder, a second decoder, a first word line driver, a second word line driver, a first read amplifier, a second read amplifier, and a phase inverter, where the control signal is connected to an enable end of the first decoder, an enable end of the first word line driver, and an enable end of the first read amplifier, an input end of the first decoder inputs an address value, a first output end of the first decoder outputs a row number, and a second output end of the first decoder outputs a column number, the first output end of the first decoder is connected to a control end of the first read amplifier, and an input end of the first read amplifier is connected to the first read line, a second output end of the first decoder is connected to a control end of the first word line driver, an output end of the first word line driver is connected to the second read line, where the control end of the first read amplifier is configured to control the first read amplifier to perform amplification processing on data of at least one input end, and the control end of the first word line driver is configured to control at least one output end of the first word line driver to output a first logical state, the control signal is connected to an input end of the phase inverter, and an output end of the phase inverter is connected to an enable end of the second decoder, an enable end of the second word line driver, and an enable end of the second read amplifier, and an input end of the second decoder inputs an address value, a first output end of the second decoder outputs a row number, and a second output end of the second decoder outputs a column number, the first output end of the second decoder is connected to a control end of the second read amplifier, and an input end of the second read amplifier is connected to the second read line, the second output end of the second decoder is connected to a control end of the second word line driver, an output end of the second word line driver is connected to the first read line, where the control end of the second read amplifier is configured to control the second read amplifier to perform amplification processing on data of at least one input end, and the control end of the second word line driver is configured to control at least one output end of the second word line driver to output the first logical state. According to this implementation, two groups of decoders, word line drivers, and read amplifiers are set. The two groups of decoders, word line drivers, and read amplifiers have different paths. A control signal is used to control one of the two groups of decoders, word line drivers, and read amplifiers to work such that the read word line and the read bit line are interchanged.

In a possible implementation, the SRAM further includes a decoder, a word line driver, a read amplifier, first selectors with a same quantity as a row quantity of the storage array, and second selectors with a same quantity as a column quantity of the storage array, where an input end of the decoder inputs an address value, a first output end of the decoder outputs a row number, and a second output end of the decoder outputs a column number, the first output end of the decoder is connected to a control end of the word line driver, where the control end of the word line driver is configured to control at least one output end of the word line driver to output a first logical state, and the second output end of the decoder is connected to a control end of the read amplifier, where the control end of the read amplifier is configured to control the read amplifier to perform amplification processing on data of at least one input end, the control signal is connected to a control end of the first selector and a control end of the second selector, a first port of the first selector is connected to the first read line, a second port of the first selector is connected to the second read line, and a third port of the first selector is connected to an output end of the word line driver, where the control end of the first selector is configured to control the first port of the first selector to connect to the third port of the first selector, or control the second port of the first selector to connect to the third port of the first selector, and a first port of the second selector is connected to the second read line, a second port of the second selector is connected to the first read line, and a third port of the second selector is connected to an input end of the read amplifier, where the control end of the second selector is configured to control the first port of the second selector to connect to the third port of the second selector, or control the second port of the second selector to connect to the third port of the second selector. According to this implementation, a selector is controlled to switch between circuit connection modes such that a read word line and a read bit line are interchanged.

According to a third aspect, a chip is provided, and the chip includes the SRAM according to the second aspect.

In a possible implementation, the chip is configured to decompose a convolution kernel in a convolutional neural network.

BRIEF DESCRIPTION OF DRAWINGS

FIG. 12 is a schematic diagram of an image matrix and a convolution kernel matrix; and FIG. 13 is a schematic diagram of convolution calculation between a 5×5 image matrix and a 3×3 convolution kernel matrix.

DESCRIPTION OF EMBODIMENTS

The embodiments of the present disclosure provide a storage unit. The storage unit includes a latch, and the latch provides a first storage bit. The storage unit further includes a first MOS transistor. A gate of the first MOS transistor is connected to the first storage bit, a source of the first MOS transistor is connected to a first read line, and a drain of the first MOS transistor is connected to a second read line. In a first state, the first read line is a read word line, and the second read line is a read bit line, or in a second state, the second read line is a read word line, and the first read line is a read bit line.

The latch may be, but is not limited to, a latch formed by circularly connecting two inverting gates. Based on a latch included in a common storage unit, an original bit line and an original word line that are corresponding to the latch are no longer used to read data.

It may be understood that the first MOS transistor may be an NMOS transistor or a PMOS transistor.

In an example, the latch further provides a second storage bit. The storage unit further includes a second MOS transistor. A gate of the second MOS transistor is connected to the second storage bit, a source of the second MOS transistor is connected to the first read line, and a drain of the second MOS transistor is connected to the second read line. According to this implementation, data of two storage bits in opposite states is separately read using a pair of MOS transistors. This can improve data reading accuracy.

In an example, the first MOS transistor is the NMOS transistor and the second MOS transistor is the PMOS transistor, or the first MOS transistor is the PMOS transistor and the second MOS transistor is the NMOS transistor.

In this embodiment of the present disclosure, based on a conventional structure of a latch that can provide a storage bit, an MOS transistor is added. A gate of the MOS transistor is connected to the storage bit, and a source and a drain of the MOS transistor are connected to a first read line and a second read line, respectively. Based on a characteristic of the MOS transistor, either of the first read line and the second read line may be used as a read bit line, and the other is used as a read word line such that the read word line and the read bit line are interchangeable. A bottom-layer hardware storage unit is changed to quickly obtain data of an address that is symmetric to a specific address about a matrix diagonal, instead of writing an algorithm into code. An SRAM in this form is equivalent to a hardware accelerator. Compared with writing an algorithm into code of a digital circuit, changing the storage unit can greatly increase a system speed, and greatly reduce power consumption and workload. Usually, one or two cycles are required to complete transpose reading, while thousands of cycles may be required when the algorithm is written into the code of the digital circuit.

Figure 1:
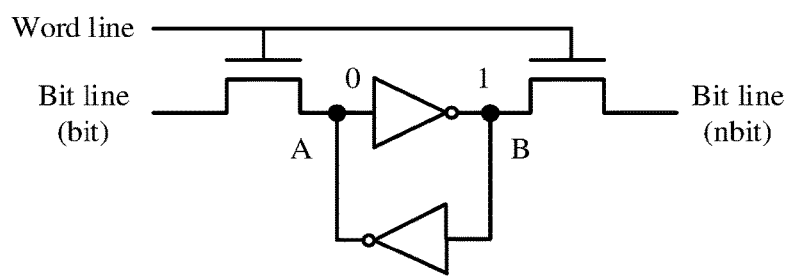
FIG. 1 is a schematic structural diagram of a storage unit of a conventional SRAM.
Figure 2:
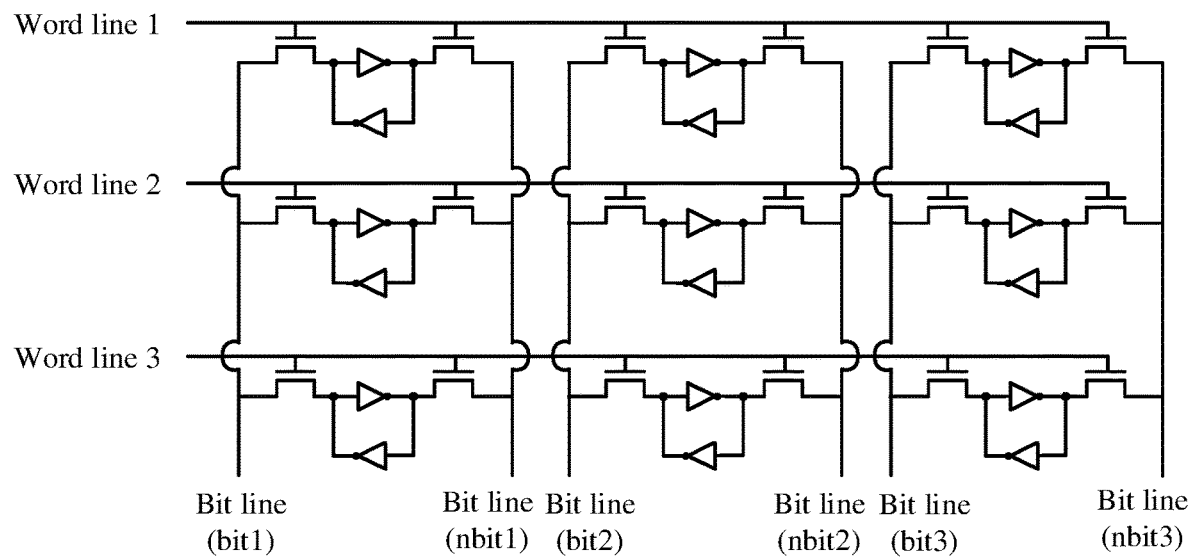
FIG. 2 is a schematic diagram of a storage array of the conventional SRAM.
Figure 3:
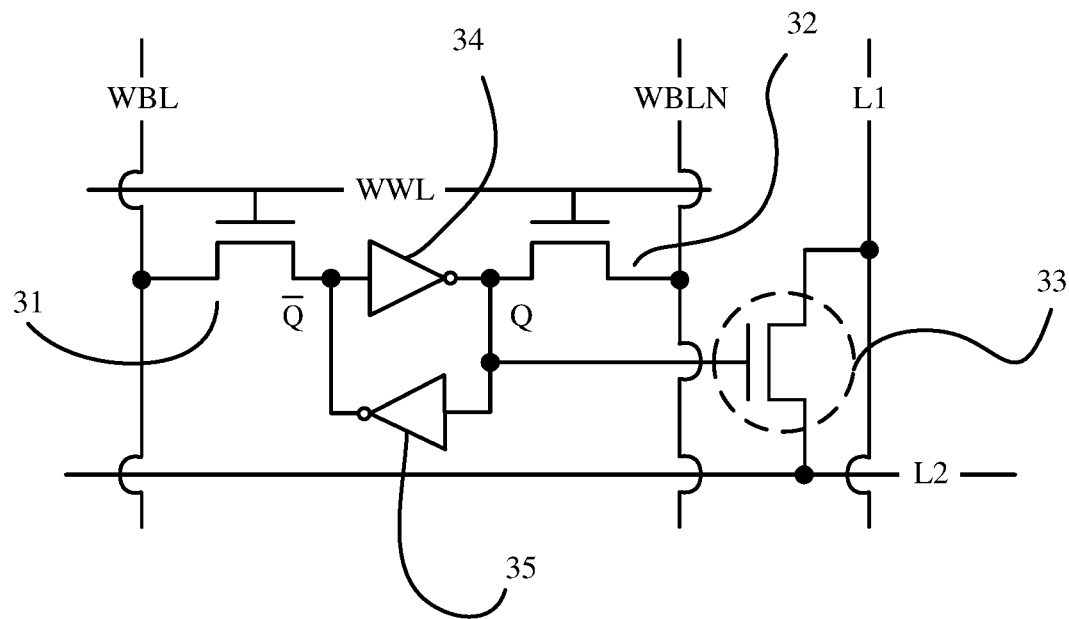
FIG. 3 is a schematic structural diagram of a storage unit of an SRAM according to an embodiment of the present disclosure.

FIG. 3 is a schematic structural diagram of a storage unit of an SRAM according to an embodiment of the present disclosure. If two inverting gates are designed based on a structure of four MOS transistors in other approaches, the storage unit in this embodiment of the present disclosure may be considered as a seven-transistor unit. An MOS transistor in a circle shown in the figure is added to a conventional six-transistor unit such that the SRAM has two modes: conventional reading and transpose reading.

The following describes a structure of the storage unit shown in FIG. 3. The storage unit includes a first MOS transistor, a second MOS transistor, a third MOS transistor, a fourth MOS transistor, a fifth MOS transistor 31, a sixth MOS transistor 32 (the fifth MOS transistor and the sixth MOS transistor are also referred to as write MOS transistors), and a seventh MOS transistor 33.

The first MOS transistor, the second MOS transistor, the third MOS transistor, and the fourth MOS transistor are not shown in FIG. 3. The first MOS transistor and the second MOS transistor form a first inverting gate 34, and the third MOS transistor and the fourth MOS transistor form a second inverting gate 35. The first inverting gate 34 and the second inverting gate 35 are connected in a head-to-tail manner to form a latch. An output end of the first inverting gate 34 is a first storage bit Q, and an output end of the second inverting gate 35 is a second storage bit $\overline{Q}$.

One of a source and a drain of the fifth MOS transistor 31 is connected to the second storage bit $\overline{Q}$, and one of a source and a drain of the sixth MOS transistor 32 is connected to the first storage bit Q. A gate of the fifth MOS transistor 31 and a gate of the sixth MOS transistor 32 are connected to a write word line (WWL), the other one of the source and the drain of the fifth MOS transistor 31 is connected to a first write bit line (WBL), and the other one of the source and the drain of the sixth MOS transistor 32 is connected to a second write bit line (WBLN). Because a logical state of the second write bit line is opposite to a logical state of the first write bit line, in this embodiment of the present disclosure, the first write bit line is denoted as WBL, and the second write bit line is denoted as WBLN. When data is written into the storage unit, the fifth MOS transistor 31 and the sixth MOS transistor 32 are conducted using the write word line. For example, when the write word line WWL is a logical 1, the logical state of the first write bit line WBL is a logical state of the data, and the data is written into the second storage bit $\overline{Q}$, or the logical state of the second write bit line WBLN is a logical state of the data, and the data is written into the first storage bit Q.

It may be understood that the first state and the second state are merely used to distinguish between two different read states, and the first state and the second state are not limited in this embodiment of the present disclosure. For example, in the first state, the first read line is a read word line, and the second read line is a read bit line, or in the second state, the second read line is a read word line, and the first read line is a read bit line. Alternatively, in the first state, the second read line is a read word line, and the first read line is a read bit line, or in the second state, the first read line is a read word line, and the second read line is a read bit line.

A gate of the seventh MOS transistor 33 is connected to one of the first storage bit Q and the second storage bit $\overline{Q}$, one of a source and a drain of the seventh MOS transistor 33 is connected to a first read line L1, and the other one of the source and the drain of the seventh MOS transistor 33 is connected to a second read line L2. When the storage unit is a first read state, the first read line L1 is a read bit line (RBL_H, where H is used to identify the first read state, and the first read state may be referred to as a first state for short), and the second read line L2 is a read word line (RWL_H). When the storage unit is a second read state, the first read line L1 is a read word line (RWL_V, where V is used to identify the second read state, and the second read state may be referred to as a second state for short), and the second read line L2 is a read bit line (RBL_V). When data is read from the storage unit, the read word line (RWL_H or RWL_V) is set to a logical 1, and data stored in one of the first storage bit Q and the second storage bit $\overline{Q}$ is read from the read bit line (RBL_H or RBL_V).

The first read state may be referred to as conventional reading, and the second read state may be referred to as transpose reading. WBL and WBLN are positive and negative write bit lines and are used to write stored data. WWL is a write word line and is used for gating access when the stored data is written. RBL_H is a read bit line used in conventional reading, and is used to read the stored data. RWL_H is a read word line used in conventional reading, and is used for gating access when the stored data is read. RWL_V is a read word line used in transpose reading, and is used for gating access when the stored data is read. RBL_V is a read bit line used in transpose reading, and is used to read the stored data. The read bit line used in conventional reading is the read word line used in transpose reading, and the read word line used in conventional reading is the read bit line used in transpose reading. Q and $\overline{Q}$ are storage bits. A 1-bit (bit) control signal, for example, T_EN, may be set for a peripheral circuit, and whether a read mode is conventional reading or transpose reading is controlled using T_EN.

In FIG. 3, the seventh MOS transistor 33 is an NMOS transistor.

Figure 4:
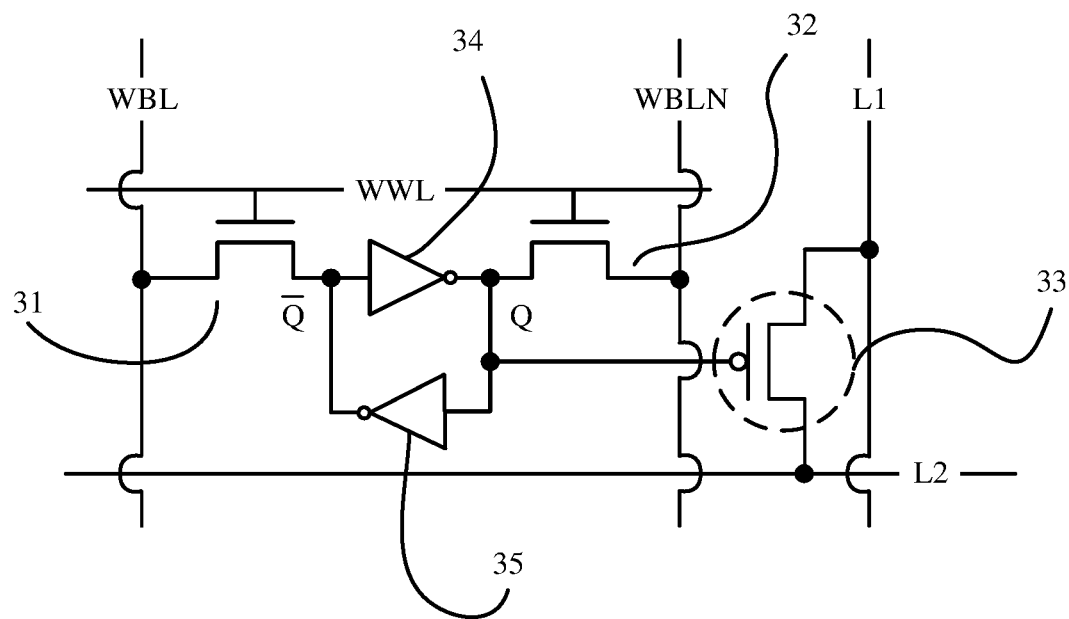
FIG. 4 is a schematic structural diagram of a storage unit of another SRAM according to an embodiment of the present disclosure.

In another embodiment of the present disclosure, the seventh MOS transistor 33 in FIG. 3 may be replaced with a PMOS transistor, as shown in a storage unit in FIG. 4.

Figure 5:
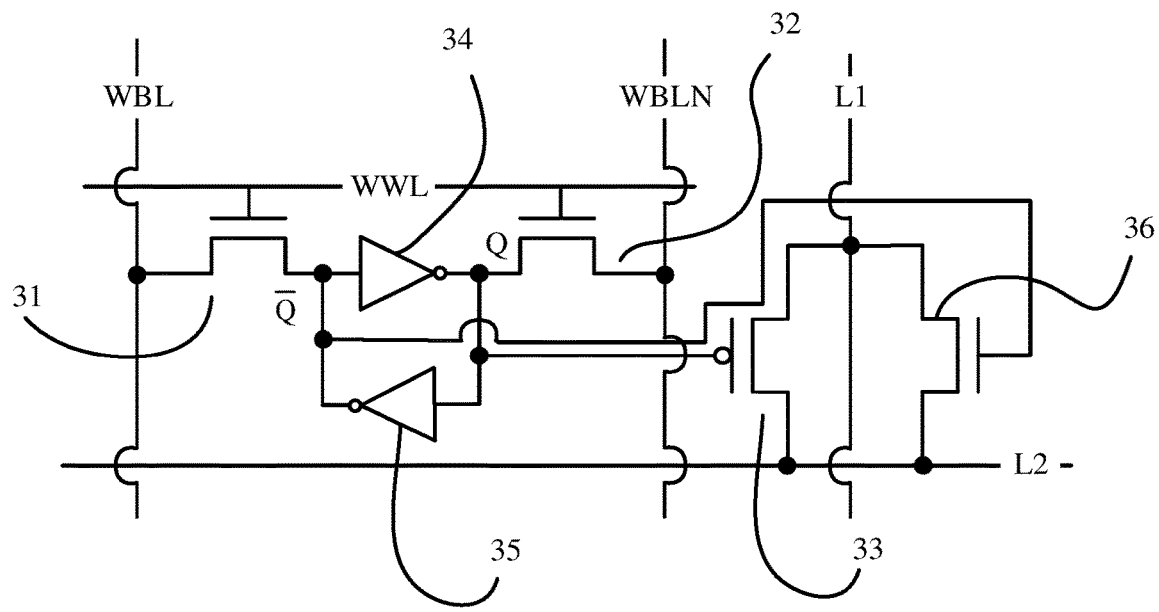
FIG. 5 is a schematic structural diagram of a storage unit of still another SRAM according to an embodiment of the present disclosure.

In still another embodiment of the present disclosure, an MOS transistor may further be added based on the storage unit shown in FIG. 3 or FIG. 4, as shown in a storage unit in FIG. 5. The storage unit further includes an eighth MOS transistor 36. A gate of the eighth MOS transistor 36 is connected to the other one of the first storage bit Q and the second storage bit $\overline{Q}$ (for example, when the seventh MOS transistor 33 is connected to the first storage bit Q, the eighth MOS transistor 36 is connected to the second storage bit $\overline{Q}$). One of a source and a drain of the eighth MOS transistor 36 is connected to the first read line L1, and the other one of the source and the drain of the eighth MOS transistor 36 is connected to the second read line L2 (for example, the source of the eighth MOS transistor 36 is connected to the first read line L1, and the drain of the eighth MOS transistor 36 is connected to the second read line L2). Referring to FIG. 5, the seventh MOS transistor 33 is a PMOS transistor, and the eighth MOS transistor 36 is an NMOS transistor. It may be understood that, alternatively, the seventh MOS transistor 33 may be an NMOS transistor, and the eighth MOS transistor 36 may be a PMOS transistor. According to this implementation, a pair of MOS transistors are used to separately read data of two storage bits in opposite states. This can improve data reading accuracy.

In a possible implementation, the storage unit is connected to the control signal. When the control signal is a first sequence, the storage unit is the first read state, to be specific, L1 is a read bit line and L2 is a read word line, and the control signal is used to control the peripheral circuit to pull up a level of L2 in order to read data from L1, or when the control signal is a second sequence, the storage unit is the second read state, to be specific, L1 is a read word line and L2 is a read bit line, and the control signal is used to control the peripheral circuit to pull up a level of L1 in order to read data from L2. According to this implementation, the control signal is used to control switching of read states of the storage unit. This is simple and quick.

In a possible implementation, a length of the first sequence is 1 bit, a length of the second sequence is 1 bit, and the first sequence is 0 and the second sequence is 1, or the first sequence is 1 and the second sequence is 0. According to this implementation, the 1-bit control signal is used to control switching of read states of the storage unit. This is simple and quick.

An embodiment of the present disclosure further provides an SRAM. The SRAM includes a plurality of storage units described above (for example, the storage unit shown in FIG. 3, FIG. 4, or FIG. 5). The plurality of storage units form a rectangular storage array with a same quantity of rows and columns. Storage units of a same row in the storage array have the same first read line, and storage units of a same column in the storage array have the same second read line. In the following description, only the storage unit shown in FIG. 3 is used as an example for description. An SRAM formed by other storage units is similar, and therefore, details are not described.

In this embodiment of the present disclosure, based on a structure of a conventional storage unit, an MOS transistor is added to the storage unit of the SRAM, and the newly added MOS transistor is the seventh MOS transistor. Because a gate of the seventh MOS transistor is connected to a storage bit, a source and a drain of the MOS transistor are connected to a first read line and a second read line, respectively. Based on a characteristic of the MOS transistor, either of the first read line and the second read line may be used as a read bit line, and the other is used as a read word line such that the read word line and the read bit line are interchangeable. A bottom-layer hardware storage unit is changed to quickly obtain data of an address that is symmetric to a specific address about a matrix diagonal, instead of writing an algorithm into code. An SRAM in this form is equivalent to a hardware accelerator. Compared with writing an algorithm into code of a digital circuit, changing the storage unit can greatly increase a system speed, and greatly reduce power consumption and workload. Usually, one or two cycles are required to complete transpose reading, while thousands of cycles may be required when the algorithm is written into the code of the digital circuit.

In an example, each storage unit is connected to the control signal. When the control signal is a first sequence, the storage unit is the first read state, or when the control signal is a second sequence, the storage unit is the second read state. According to this implementation, the control signal is used to control switching of read states of the storage unit of the SRAM. This is simple and quick.

In an example, a length of the first sequence is 1 bit, a length of the second sequence is 1 bit, and the first sequence is 0 and the second sequence is 1, or the first sequence is 1 and the second sequence is 0. According to this implementation, the 1-bit control signal is used to control switching of read states of the storage unit of the SRAM. This is simple and quick. In this embodiment of the present disclosure, only an example in which the control signal is 1 bit is used for description.

Figure 6:
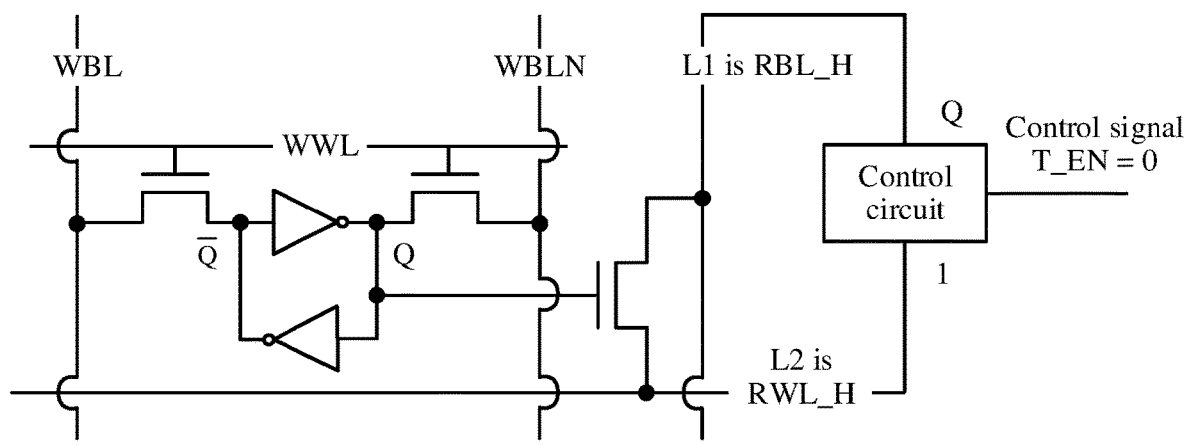
FIG. 6 is a schematic diagram of reading by a storage unit in conventional reading according to an embodiment of the present disclosure.
Figure 7:
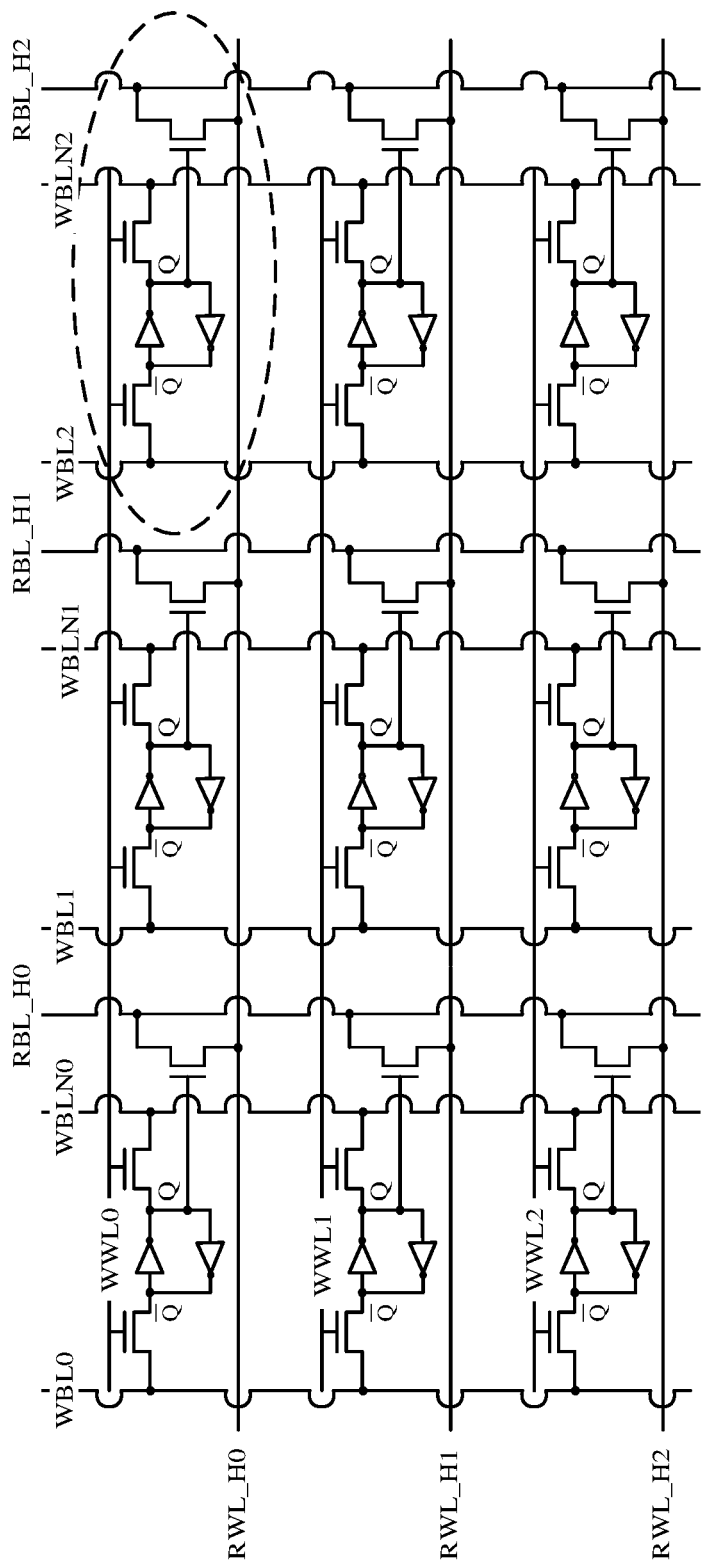
FIG. 7 is a schematic diagram of reading by a storage array in conventional reading according to an embodiment of the present disclosure.

FIG. 6 is a schematic diagram of reading by a storage unit in conventional reading. When data is read, if a control signal T_EN=0, the control signal drives a control circuit to pull up a level of L2 and read the data from L1. In this case, an SRAM read mode is conventional reading, where a vertical line is a read bit line RBL_H, and a horizontal line is a read word line RWL_H. The read word line RWL_H remains to be 1. If a value stored in a node Q is 0, and an added MOS transistor is turned off, data read from the read bit line RBL_H is 0. If a value stored in a node Q is 1, and an added MOS transistor is turned on, data read from the read bit line RBL_H is 1. FIG. 7 is a schematic diagram of reading by a storage array in conventional reading. It is assumed that data stored in a storage unit whose word line number is 0 and bit line number is 2 needs to be read, data in (RBL_H2, RWL_H0) is read, that is, data in a rightmost storage unit in a first row is read.

Figure 8:
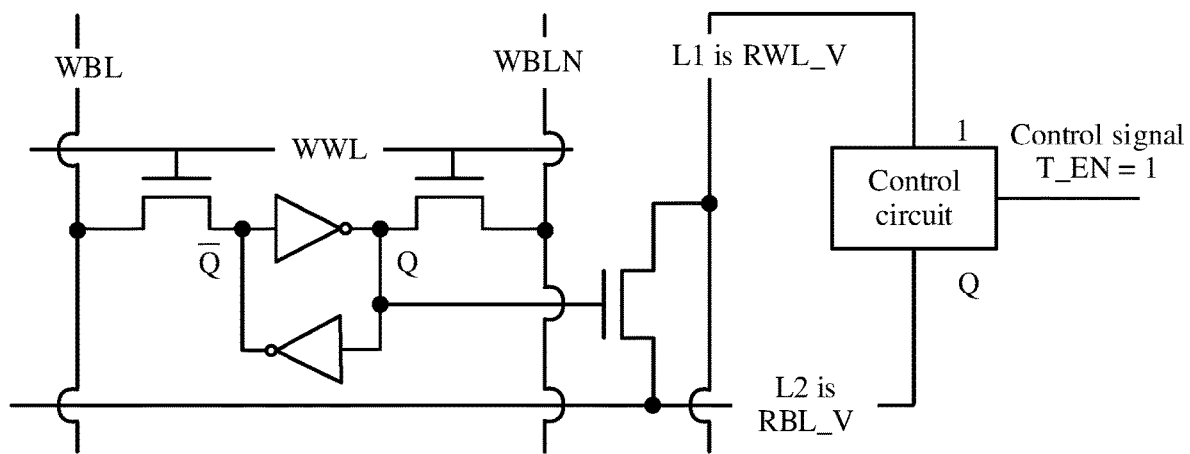
FIG. 8 is a schematic diagram of reading by a storage unit in transpose reading according to an embodiment of the present disclosure.
Figure 9:
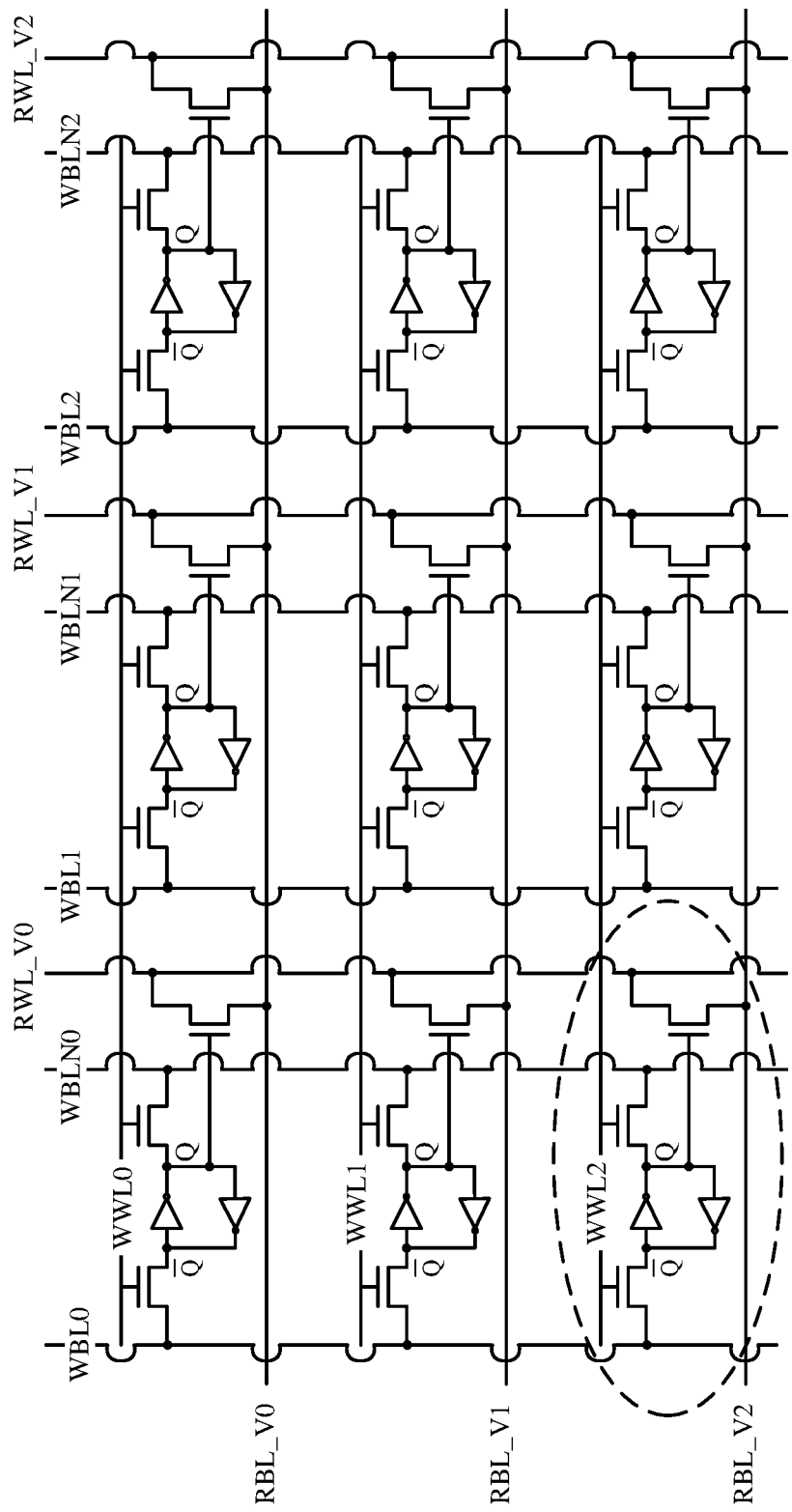
FIG. 9 is a schematic diagram of reading by a storage array in transpose reading according to an embodiment of the present disclosure.

FIG. 8 is a schematic diagram of reading by a storage unit in transpose reading. When data is read, if a control signal T_EN=1, the control signal drives a control circuit to pull up a level of L1 and read the data from L2. In this case, an SRAM read mode is transpose reading, where a horizontal line becomes a read bit line RBL_V, and a vertical line becomes a read word line RWL_V. In this embodiment of the present disclosure, values of a word line and a bit line that are sent from a logical circuit outside the storage array are not changed, but the word line and the bit line are changed, to be specific, the word line and the bit line are interchanged. FIG. 9 is a schematic diagram of reading by a storage array in transpose reading. It is assumed that data stored in a storage unit whose word line number is 0 and bit line number is 2 still needs to be read, as shown in FIG. 9, data in (RBL_V2, RWL_V0) is read in this case, that is, data stored in a topmost storage unit in a first column is read, and data in a storage unit that is symmetric to the storage unit in conventional reading in FIG. 7 about a matrix diagonal is read. In this way, data of a storage address that is symmetric to a storage address about a diagonal of the storage array can be read in only one cycle namely, one clock cycle), thereby greatly improving a system speed and greatly reducing power consumption and workload.

In a possible implementation, each storage unit is connected to a control signal. When the control signal is a first sequence, the storage unit is the first read state, or when the control signal is a second sequence, the storage unit is the second read state. According to this implementation, the control signal is used to control switching of read states of the storage unit of the SRAM. This is simple and quick.

In a possible implementation, a length of the first sequence is 1 bit, a length of the second sequence is 1 bit, and the first sequence is 0 and the second sequence is 1, or the first sequence is 1 and the second sequence is 0. According to this implementation, the 1-bit control signal is used to control switching of read states of the storage unit of the SRAM. This is simple and quick.

In this embodiment of the present disclosure, the control signal can be used to control a control circuit outside the storage array to switch the SRAM between the first read state and the second read state.

Figure 10:
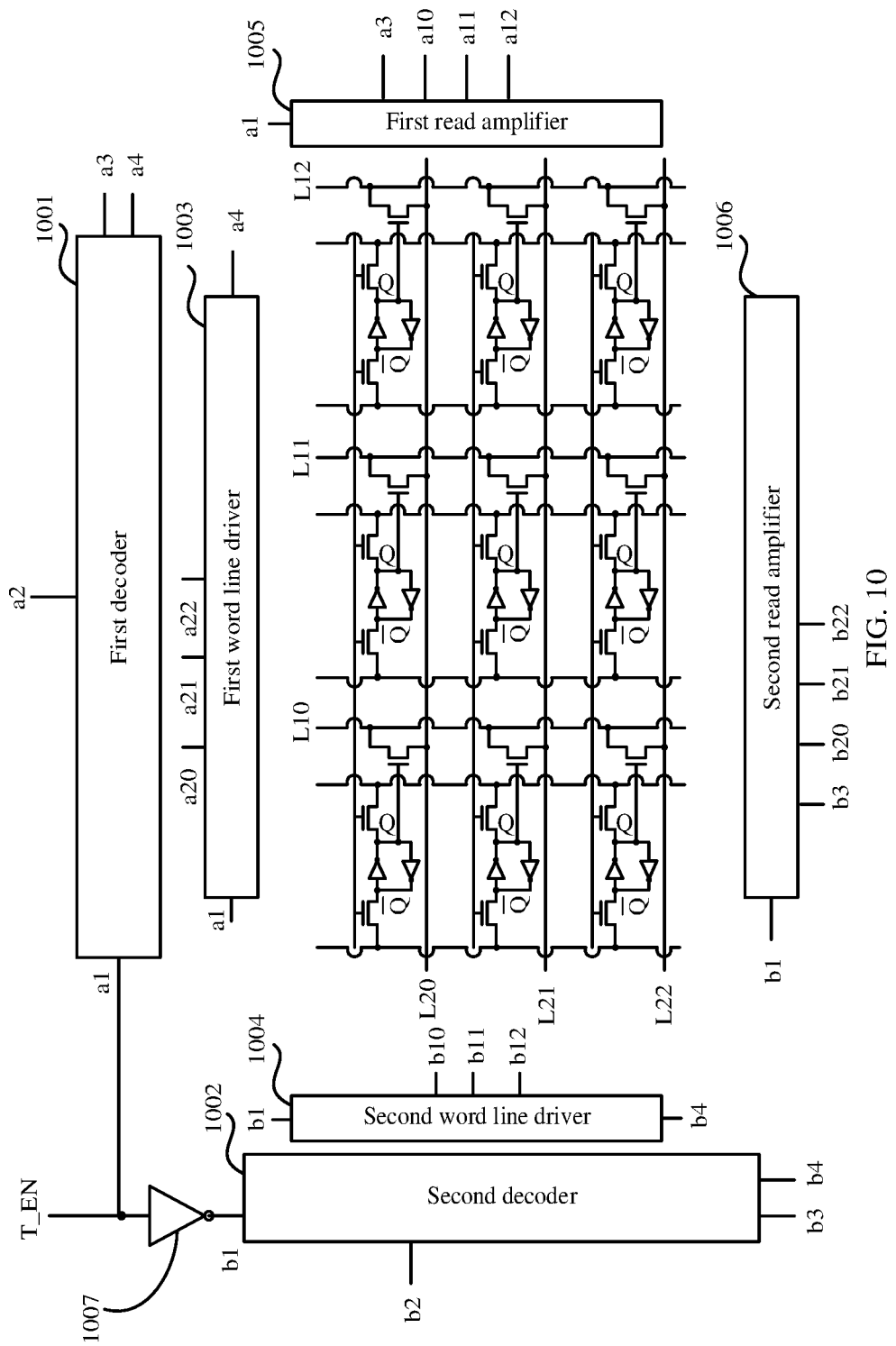
FIG. 10 is a schematic diagram of a control circuit according to an embodiment of the present disclosure.

FIG. 10 is a schematic diagram of a control circuit according to an embodiment of the present disclosure. In addition to a storage array, the SRAM includes a control circuit of the following structure. A first decoder 1001, a second decoder 1002, a first word line driver 1003, a second word line driver 1004, a first read amplifier 1005, a second read amplifier 1006, and a phase inverter 1007. The control signal T_EN is connected to an enable end (a1) of the first decoder 1001, an enable end (a1) of the first word line driver 1003, and an enable end (a1) of the first read amplifier 1005. An input end (a2) of the first decoder 1001 inputs an address value, a first output end (a3) of the first decoder 1001 outputs a row number, and a second output end (a4) of the first decoder 1001 outputs a column number. The first output end (a3) of the first decoder 1001 is connected to a control end (a3) of the first read amplifier 1005, and input ends (a10, a11, and a12) of the first read amplifier 1005 are connected to first read lines (namely, a vertical line L10, L11, and L12). The second output end (a4) of the first decoder 1001 is connected to a control end (a4) of the first word line driver 1003, and output ends (a20, a21, and a22) of the first word line driver 1003 are connected to second read lines (namely, a horizontal line L20, L21, and L22). The control end (a3) of the first read amplifier 1005 is configured to control the first read amplifier 1005 to perform amplification processing on data of at least one input end (a10, a11, and a12), and the control end (a4) of the first word line driver 1003 is configured to control at least one output end (a20, a21, and a22) of the first word line driver 1003 to output a logical 1. The control signal is connected to an input end of the phase inverter 1007, and an output end of the phase inverter 1007 is connected to an enable end (b1) of the second decoder 1002, an enable end (b1) of the second word line driver 1004, and an enable end (b1) of the second read amplifier 1006. An input end (b2) of the second decoder 1002 inputs an address value, a first output end (b3) of the second decoder 1002 outputs a row number, and a second output end (b4) of the second decoder 1002 outputs a column number. The first output end (b3) of the second decoder 1002 is connected to a control end (b3) of the second read amplifier 1006, and input ends (b20, b21, and b22) of the second read amplifier 1006 are connected to the second read lines (namely, the horizontal lines L20, L21, and L22). The second output end (b4) of the second decoder 1002 is connected to a control end (b4) of the second word line driver 1004, output ends (b10, b11, and b12) of the second word line driver 1004 are connected to the first read lines (namely, the vertical lines L10, L11, and L12). The control end (b3) of the second read amplifier 1006 is configured to control the second read amplifier 1006 to perform amplification processing on data of at least one input end (b20, b21, and b22), and the control end (b4) of the second word line driver 1004 is configured to control at least one output end (b10, b11, and b12) of the second word line driver 1004 to output a logical 1. According to this implementation, two groups of decoders, word line drivers, and read amplifiers are set. The two groups of decoders, word line drivers, and read amplifiers have different paths. A control signal is used to control one of the two groups of decoders, word line drivers, and read amplifiers to work such that the read word line and the read bit line are interchanged.

Figure 11:
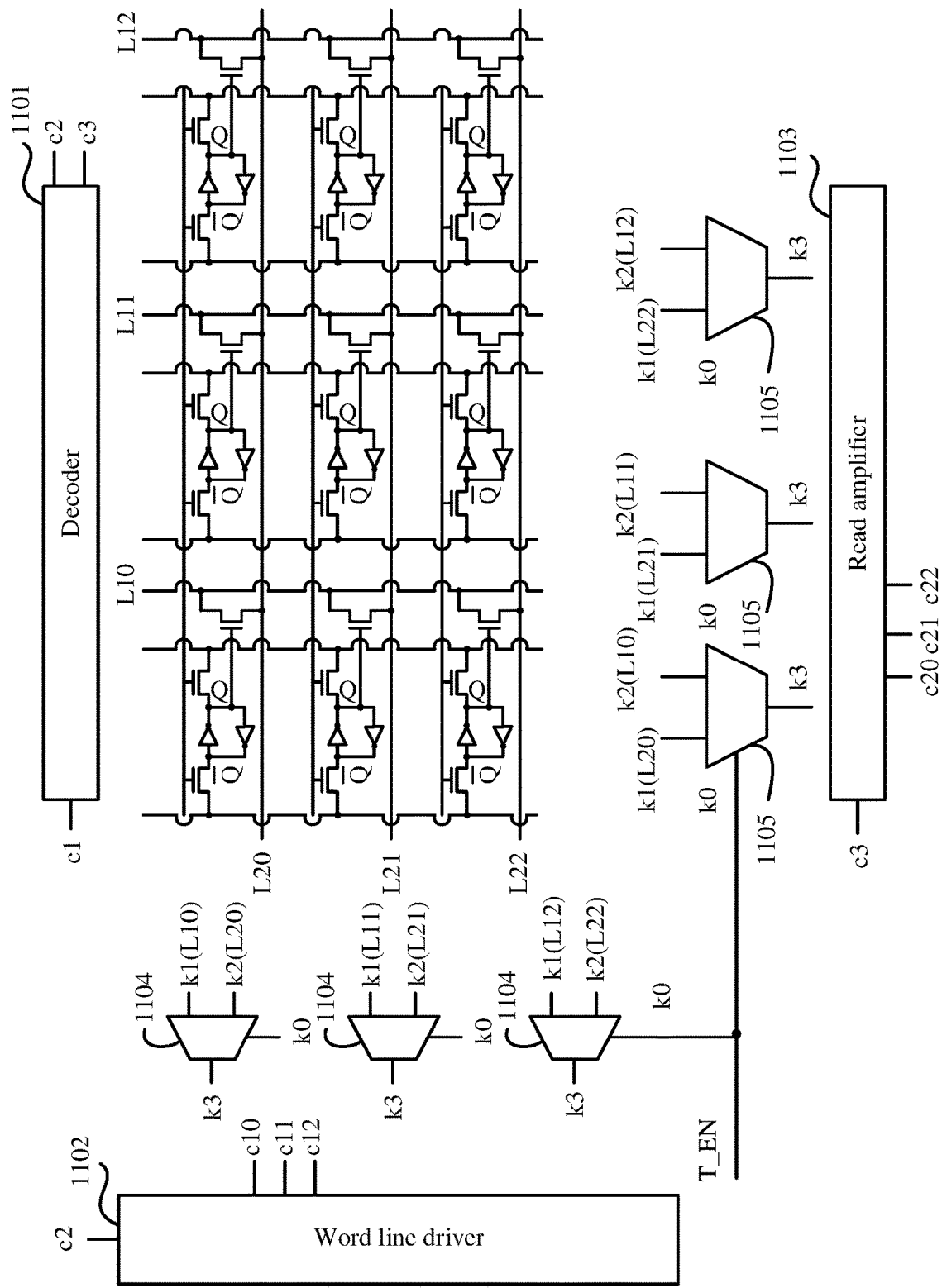
FIG. 11 is a schematic diagram of another control circuit according to an embodiment of the present disclosure.

FIG. 11 is a schematic diagram of another control circuit according to an embodiment of the present disclosure. In addition to a storage array, the SRAM includes a control circuit of the following structure a decoder 1101, a word line driver 1102, a read amplifier 1103, first selectors 1104 with a same quantity as a row quantity of the storage array, and second selectors 1105 with a same quantity as a column quantity of the storage array. An input end (c1) of the decoder 1101 inputs an address value, a first output end (c2) of the decoder 1101 outputs a row number, and a second output end (c3) of the decoder 1101 outputs a column number. The first output end (c2) of the decoder 1101 is connected to a control end (c2) of the word line driver 1102, the control end (c2) of the word line driver 1102 is configured to control at least one output end (c10, c11, and c12) of the word line driver 1102 to output a logical 1, the second output end (c3) of the decoder 1101 is connected to a control end (c3) of the read amplifier 1103, and the control end (c3) of the read amplifier 1103 is configured to control the read amplifier 1103 to perform amplification processing on data of at least one input end (c20, c21, and c22). The control signal T_EN is connected to control ends (k0) of the first selectors 1104 and control ends (k0) of the second selectors 1105. First ports (k1) of the first selectors 1104 are connected to first read lines (namely, the vertical lines L10, L11, and L12, for example, first ports (k1) of three first selectors 1104 from top to bottom are respectively connected to L10, L11, and L12), second ports (k2) of the first selectors 1104 are connected to second read lines (namely, the horizontal lines L20, L21, and L22, for example, second ports (k2) of three first selectors 1104 from top to bottom are respectively connected to L20, L21, and L22), and third ports (k3) of the first selectors 1104 are connected to output ends of the word line driver 1102 (c10, c11, and c12. For example, third ports (k3) of three first selectors 1104 from top to bottom are respectively connected to c10, c11, and c12). Control ends (k0) of the first selectors 1104 are configured to control the first ports (k1) of the first selectors 1104 to connect to the third ports (k3) of the first selectors 1104, or control the second ports (k2) of the first selectors 1104 to connect to the third ports (k3) of the first selectors 1104. First ports (k1) of the second selectors 1105 are connected to the second read lines (namely, the horizontal lines L20, L21, and L22), second ports (k2) of the second selectors 1105 are connected to the first read lines (namely, the vertical lines L10, L11, and L12), and third ports (k3) of the second selectors 1105 are connected to input ends of the read amplifier 1103 (c20, c21, and c22, for example, first ports (k3) of three second selectors 1105 from left to right are respectively connected to c20, c21, and c22). The control ends (k0) of the second selectors 1105 are configured to control the first ports (k1) of the second selectors 1105 to connect to the third ports (k3) of the second selectors 1105, or control the second ports (k2) of the second selectors 1105 to connect to the third ports (k3) of the second selectors 1105. According to this implementation, the control signal T_EN is used to control a selector to switch between circuit connection modes such that a read word line and a read bit line are interchanged.

In the embodiments of the present disclosure, the SRAM may be disposed on a chip with a specific function, or may be independent of the foregoing chip. The chip may be a chip on which a large amount of fast matrix calculation is performed. For example, in the field of artificial intelligence, an SRAM customized on a convolutional neural network (CNN) chip can be used for quick decomposition of a convolution kernel. The SRAM in the embodiments of the present disclosure may also be used as an SRAM on some encryption chips.

The following describes some effects of the SRAM customized on the CNN chip.

With intelligence of chips, based on a standard single-instruction multiple-data (SIMD) stream, data communication on a bus may further be reduced because of a special multiplexing mechanism of a CNN. The concept of multiplexing is very important to an ultra-large neural network. For mid-high-level convolution kernels in these models, a parameter amount of convolution kernels may reach 3×3× 512. Properly decomposing these ultra-large convolution kernels to effective hardware becomes a problem worth studying.

Using the SRAM in transpose reading mentioned in this embodiment of the present disclosure, to be specific, when a bit line and a word line may be interchanged during data reading, additional data processing in the convolutional network can be omitted, processing power consumption of the CNN can be reduced, and a concept of underlying hardware can be provided for a large convolution structure.

Figures 12, 13:
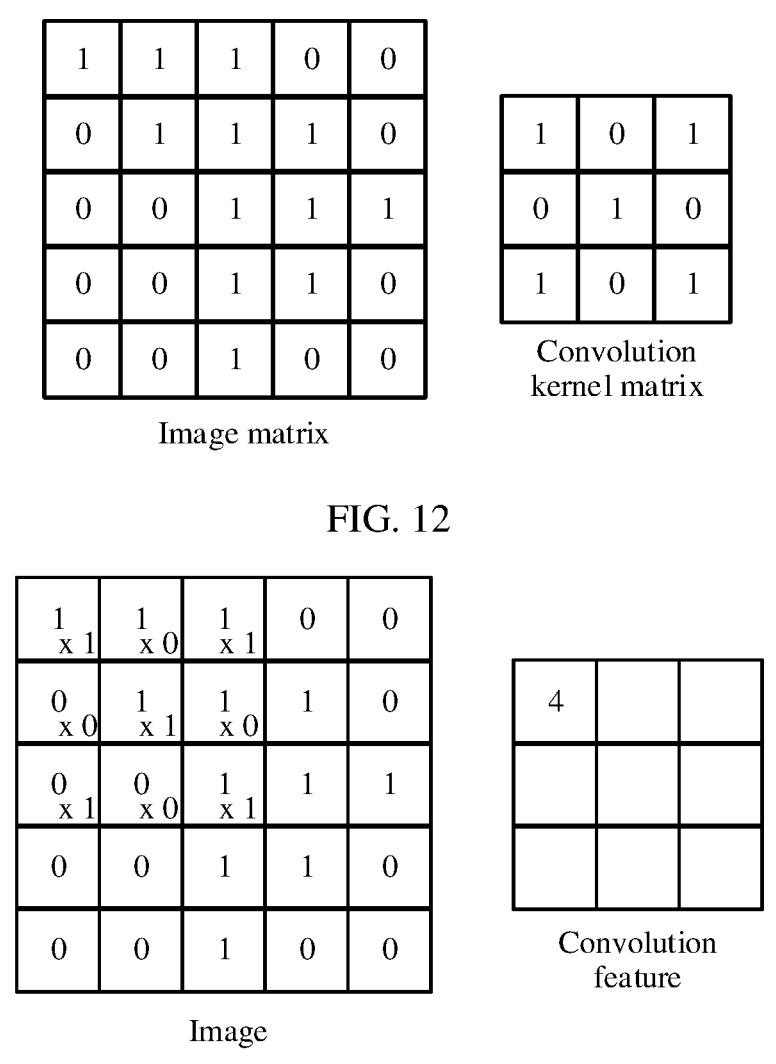

The name of the convolutional network comes from a "convolution" operation. A basic purpose of convolution is to extract features from an input image. Convolution means that an image feature is learned using data in a small square matrix such that a spatial relationship between pixels may be retained. As described above, each image is a matrix of pixel values. Considering a 5×5 image, pixel values of the image are 0 and 1. In FIG. 12, a left matrix is an image matrix, the image matrix is a special case of a gray-scale image (pixel values of a conventional gray-scale image are 0 to 255), and a right matrix is a convolution kernel matrix, and the convolution kernel matrix is a 3×3 matrix. FIG. 13 is a schematic diagram of convolution calculation between a 5×5 image matrix and a 3×3 convolution kernel matrix. Each 3×3 sub-matrix in the left image matrix is multiplied by a 3×3 convolution kernel matrix, and then a value obtained by adding results of multiplying in all positions is placed in a new matrix, namely, the right matrix in FIG. 13. The matrix is a new image matrix generated after a convolution operation is performed on an original image matrix and an original convolution kernel matrix.

The 3×3 matrix in FIG. 12 or FIG. 13 is also referred to as a "filter", a "convolution kernel", or a "feature detector". A matrix obtained by sliding the filter on the original image and multiplying matrices is referred to as a "convolution feature", "excitation mapping", or "feature mapping". The filter is a feature detector for an original input image. An image is considered as a matrix, and new images are obtained after convolution operations are performed on the image and different convolution kernel matrices. Performing a convolution operation on the different convolution kernel matrices produces different effects. The convolution kernel is decomposed. For example, a two-dimensional convolution kernel that is symmetrical about a diagonal is decomposed into two one-dimensional convolution kernels. Convolution calculation performed on an image matrix (donated as A) and a two-dimensional convolution kernel matrix (denoted as C) may be approximately convolution calculation performed on the image matrix and two one-dimensional convolution kernel matrices (denoted as S1 and S2), that is:

$$A \otimes C \approx (A \otimes S1) \otimes S2 \ (\otimes \text{ is a convolution operation symbol}).$$

Substituting S1 and S2 for the two-dimensional convolution kernel matrix C is referred to as decomposition of the convolution kernel. S1 and S2 are one-dimensional matrices that are symmetric about a diagonal of a two-dimensional matrix C.

If a conventional SRAM is used, and a convolution kernel needs to be decomposed, data of an address that is symmetrical to a specific address in relation to a matrix diagonal cannot be directly obtained, and the data needs to be processed by writing an algorithm into code of an SRAM peripheral digital circuit. The SRAM in the embodiments of the present disclosure is applied to the convolutional neural network chip such that the convolution kernel can be quickly decomposed, power consumption of frequently decomposing the convolution kernel can be greatly reduced, and a speed of the operation can be greatly increased.

The objectives, technical solutions, and benefits of the present disclosure are further described in detail in the foregoing specific embodiments. It should be understood that the foregoing descriptions are merely specific implementations of the present disclosure, but are not intended to limit the protection scope of the present disclosure. Any modification, equivalent replacement, or improvement made based on the technical solutions of the present disclosure shall fall within the protection scope of the present disclosure.

What is claimed is:

1. A storage unit, comprising:
   a latch configured to provide a first storage bit; and
   a first metal-oxide-semiconductor (MOS) transistor coupled to the latch and comprising:
      a first gate configured to receive the first storage bit from the latch;
      a first source coupled to a first read line, and
      a first drain coupled to a second read line,
      wherein, in a first state, the first read line is a first read word line and the second read line is a first read bit line, and
      wherein, in a second state, the second read line is a second read word line and the first read line is a second read bit line.

2. The storage unit of claim 1, wherein the latch is further configured to provide a second storage bit, wherein the storage unit further comprises a second MOS transistor, and wherein the second MOS transistor comprises:
   a second gate configured to receive the second storage bit from the latch;
   a second source coupled to the first read line; and
   a second drain coupled to the second read line.

3. The storage unit of claim 2, wherein the first MOS transistor is an N-type MOS (NMOS) transistor, and wherein the second MOS transistor is a P-type (PMOS) transistor.

4. The storage unit of claim 2, wherein the first MOS transistor is a P-type MOS (PMOS) transistor, and wherein the second MOS transistor is an N-type (NMOS) transistor.

5. The storage unit of claim 1, wherein the first state and the second state are different.

6. A static random access memory, comprising a plurality of storage units, wherein each of the storage units comprises:
   a latch configured to provide a first storage bit; and
   a first metal-oxide-semiconductor (MOS) transistor coupled to the latch and comprising:
      a first gate configured to receive the first storage bit from the latch;
      a first source coupled to a first read line; and
      a first drain coupled to a second read line,
      wherein, in a first state, the first read line is a first read word line and the second read line is a first read bit line, and
      wherein, in a second state, the second read line is a second read word line and the first read line is a second read bit line,
   wherein the plurality of the storage units form a rectangular storage array with a same quantity of rows and columns,
   wherein the storage units of a same row in the rectangular storage array are coupled to a same first read line, and
   wherein the storage units of a same column in the rectangular storage array are coupled to a same second read line.

7. The static random access memory of claim 6, wherein the latch is further configured to provide a second storage bit, wherein each of the storage units further comprises a second MOS transistor, and wherein the second MOS transistor comprises:
   a second gate configured to receive the second storage bit from the latch;
   a second source coupled to the first read line; and
   a second drain coupled to the second read line.

8. The static random access memory of claim 6, wherein each of the storage units is configured to receive a control signal, wherein each of the storage units is in the first state when the control signal is a first sequence, and wherein each of the storage units is in the second state when the control signal is a second sequence.

9. The static random access memory of claim 8, wherein a length of the first sequence is 1 bit, wherein a length of the second sequence is 1 bit, and wherein the first sequence is 0 and the second sequence is 1.

10. The static random access memory of claim 8, further comprising:
    a first decoder comprising:
       a first enable end coupled to the control signal;
       a first input end configured to receive a first address value;
       a first output end configured to output a first row number; and
       a second output end configured to output a first column number;
    a second decoder comprising:
       a second enable end;
       a second input end configured to input a second address value;
       a third output end configured to output a second row number; and
       a fourth output end configured to output a second column number;
    a first word line driver comprising:
       a fifth output end coupled to the second read line;
       a third enable end coupled to the control signal; and a first control end coupled to the second output end and configured to control the fifth output end to output a first logical state;

second word line driver comprising:
a fourth enable end;
a sixth output end coupled to the first read line; and
a second control end coupled to the fourth output end and configured to control the sixth output end to output the first logical state;

a first read amplifier comprising:
a third input end coupled to the to the first read line and configured to input first data;
a fifth enable end coupled to the control signal; and
a third control end coupled to the first output end and configured to control the first read amplifier to perform an amplification processing on the first data;

a second read amplifier comprising:
a sixth enable end;
a fourth input end coupled to the second read line and configured to input second data; and
a fourth control end coupled to the third output end and configured to control the second read amplifier to perform the amplification processing on the second data; and a phase inverter comprising:
a fifth input end coupled to the control signal; and
a seventh output end coupled to the second enable end, the fourth enable end and the sixth enable end.

11. The static random access memory of claim 8, further comprising:
a decoder comprising:
a first input end configured to receive an address value;
a first output end configured to output a row number; and
a second output end configured to output a column number;

a word line driver comprising:
a third output end; and
a first control end coupled to the first output end and configured to control the third output end to output a first logical state;

a read amplifier comprising:
a second input end configured to receive data; and
a second control end coupled to the second output end and configured to control the read amplifier to perform amplification processing on the data;

a plurality of first selectors with a same quantity as a row quantity of the rectangular storage array, wherein each of the first selectors comprises:
a first port coupled to the first read line;
a second port coupled to the second read line;
a third port coupled to the third output end; and
a third control end coupled to the control signal and configured to control the first port to couple to the third port or control the second port to couple to the third port; and a plurality of second selectors with a same quantity as a column quantity of the rectangular storage array, wherein each of the second selectors comprises:
a fourth port coupled to the second read line;
a firth port coupled to the first read line;
a sixth port coupled to the second input end; and
a fourth control end is coupled to the control signal and configured to control the fourth port to couple to the sixth port or control the fifth port to couple to the sixth port.

12. The static random access memory of claim 6, wherein the first state and the second state are two different read states.

13. A storage unit, comprising:
a latch to provide a first storage bit; and
a first metal-oxide-semiconductor (MOS) transistor coupled to the latch and comprising:
a gate configured to receive the first storage bit from the latch;
a source coupled to a first read line; and
a drain coupled to a second read line,
wherein the storage unit is configured to set the first read line and the second read line as either a read word line or a read bit line according to a control signal.

14. The storage unit of claim 13, wherein the storage unit is further configured to:
set the first read line as the read word line according to the control signal; and
set the second read line as the read bit line according to the control signal.

15. The storage unit of claim 13, wherein the storage unit is further configured to:
set the first read line as the read word line when the control signal is a first sequence; and
set the second read line as the read bit line when the control signal is the first sequence.

16. The storage unit of claim 15, wherein a length of the first sequence is 1 bit, wherein a length of a second sequence is 1 bit, and wherein the first sequence is 0 and the second sequence is 1.

17. The storage unit of claim 15, wherein a length of the first sequence is 1 bit, wherein a length of a second sequence is 1 bit, and wherein the first sequence is 1 and the second sequence is 0.

18. The storage unit of claim 13, wherein the storage unit is further configured to:
set the first read line as the read bit line according to the control signal; and
set the second read line as the read word line according to the control signal.

19. The storage unit of claim 13, wherein the storage unit is further configured to:
set the first read line as the read bit line when the control signal is a second sequence; and
set the second read line as the read word line when the control signal is the second sequence.

20. The static random access memory of claim 8, wherein a length of the first sequence is 1 bit, wherein a length of the second sequence is 1 bit, and wherein the first sequence is 1 and the second sequence is 0.

* * * * *

UNITED STATES PATENT AND TRADEMARK OFFICE
CERTIFICATE OF CORRECTION

PATENT NO. : 11,004,502 B2
APPLICATION NO. : 16/807594
DATED : May 11, 2021
INVENTOR(S) : Sijie Chi et al.

Page 1 of 1

It is certified that error appears in the above-identified patent and that said Letters Patent is hereby corrected as shown below:

In the Claims

Claim 11, Column 15, Line 61: "a firth port" should read "a fifth port"

Claim 13, Column 16, Line 10: "latch to provide" should read "latch configured to provide"

Signed and Sealed this
Twenty-ninth Day of June, 2021

Drew Hirshfeld
*Performing the Functions and Duties of the*
*Under Secretary of Commerce for Intellectual Property and*
*Director of the United States Patent and Trademark Office*